United States Patent

Shimura et al.

(10) Patent No.: US 7,187,525 B2
(45) Date of Patent: Mar. 6, 2007

(54) MAGNETORESISTIVE DEVICE AND METHOD FOR MANUFACTURING SAME

(75) Inventors: Ken-ichi Shimura, Minato-ku (JP); Atsushi Kamijo, Minato-ku (JP); Yoshiyuki Fukumoto, Minato-ku (JP); Kaoru Mori, Minato-ku (JP)

(73) Assignee: NEC Corporation, Tokyo (JP)

( * ) Notice: Subject to any disclaimer, the term of this patent is extended or adjusted under 35 U.S.C. 154(b) by 378 days.

(21) Appl. No.: 10/497,024

(22) PCT Filed: Sep. 19, 2003

(86) PCT No.: PCT/JP03/11955

§ 371 (c)(1),
(2), (4) Date: May 28, 2004

(87) PCT Pub. No.: WO2004/030114

PCT Pub. Date: Apr. 8, 2004

(65) Prior Publication Data

US 2005/0219769 A1    Oct. 6, 2005

(30) Foreign Application Priority Data

Sep. 27, 2002   (JP) .............................. 2002-284553

(51) Int. Cl.
  *G11B 5/39* (2006.01)
  *H01L 43/08* (2006.01)
  *G11C 11/16* (2006.01)

(52) U.S. Cl. .................... 360/324.2; 257/421; 365/158

(58) Field of Classification Search ............. 360/324.2, 360/324.11, 324.12
See application file for complete search history.

(56) References Cited

U.S. PATENT DOCUMENTS

| 5,476,680 | A | * | 12/1995 | Coffey et al. ............... 427/130 |
| 5,650,958 | A |   | 7/1997  | Gallagher et al. |
| 5,948,550 | A | * | 9/1999  | Fujii et al. .................. 428/680 |
| 5,958,611 | A | * | 9/1999  | Ohta et al. ............... 428/811.2 |
| 5,966,012 | A |   | 10/1999 | Parkin |
| 6,141,191 | A | * | 10/2000 | Lee et al. ................. 360/324.1 |
| 2001/0017753 | A1 | * | 8/2001 | Mori et al. ............ 360/324.12 |
| 2002/0008016 | A1 |  | 1/2002 | Hayashi et al. |
| 2002/0030950 | A1 |  | 3/2002 | Sano et al. |

FOREIGN PATENT DOCUMENTS

| JP | 4-103014 A | 1/1992 |
| JP | 5-235435 A | 9/1993 |

(Continued)

*Primary Examiner*—William J Klimowicz
(74) *Attorney, Agent, or Firm*—Sughrue Mion, PLLC (57) ABSTRACT

The heat resistance of a magnetic resistance device utilizing the TMR effect is improved. Also, the Neel effect of the magnetic resistance device utilizing the TMR effect is restrained. The magnetic resistance device includes a first ferromagnetic layer formed of ferromagnetic material, a non-magnetic insulative tunnel barrier layer coupled to the first ferromagnetic layer, a second ferromagnetic layer formed of ferromagnetic material and coupled to the tunnel barrier layer, and an anti-ferromagnetic layer formed of anti-ferromagnetic material. The second ferromagnetic layer is provided between the tunnel barrier layer and the anti-ferromagnetic layer. A perpendicular line from an optional position of the surface of the second ferromagnetic layer passes through at least two of the crystal grains of the second ferromagnetic layer.

10 Claims, 9 Drawing Sheets

FOREIGN PATENT DOCUMENTS

| | | | |
|---|---|---|---|
| JP | 09-23031 A | | 1/1997 |
| JP | 11074121 A | * | 3/1999 |
| JP | 11-238923 A | | 8/1999 |
| JP | 2000-156530 A | | 6/2000 |
| JP | 2000216020 A | * | 8/2000 |
| JP | 2001036166 A | * | 2/2001 |
| JP | 2001-76329 A | | 3/2001 |
| JP | 2001-101622 A | | 4/2001 |
| JP | 2001-345493 A | | 12/2001 |
| JP | 2001345494 A | * | 12/2001 |
| JP | 2002-94141 A | | 3/2002 |
| JP | 2002-158381 A | | 5/2002 |

* cited by examiner

| | MATERIAL OF NON-MAGNETIC LAYER 12 | THICKNESS OF NON-MAGNETIC LAYER 12 |
|---|---|---|
| EE3 (EXPERIMENTAL EXAMPLE) | Al | 0.3nm |
| EE4 (EXPERIMENTAL EXAMPLE) | Al | 0.5nm |
| EE5 (EXPERIMENTAL EXAMPLE) | Al | 0.7nm |
| EE6 (EXPERIMENTAL EXAMPLE) | Al | 1.0nm |
| EE7 (EXPERIMENTAL EXAMPLE) | Al | 1.5nm |
| EE8 (EXPERIMENTAL EXAMPLE) | Ta | 0.3nm |
| EE9 (EXPERIMENTAL EXAMPLE) | Ta | 0.5nm |
| EE10 (EXPERIMENTAL EXAMPLE) | Ta | 0.7nm |
| EE11 (EXPERIMENTAL EXAMPLE) | Ta | 1.0nm |
| EE12 (EXPERIMENTAL EXAMPLE) | Ta | 1.5nm |

MAGNETORESISTIVE DEVICE AND METHOD FOR MANUFACTURING SAME

TECHNICAL FIELD

The present invention relates to a magnetic resistance device, and more particularly, the present invention relates to a magnetic resistance device with heat resistance improved.

BACKGROUND ART

A development is carried forward to apply a magnetic resistance device showing a tunnel magnetic resistance effect (TMR effect) to a magnetic random access memory (MRAM) and a reproduction magnetic head of a high density magnetic recording apparatus. The TMR effect is a kind of magneto-resistance effect. As the magneto-resistance effect, a giant magnetic resistance effect (GMR effect) is known in addition to the TMR effect. However, the TMR effect which shows the magneto-resistance effect larger than the giant magnetic resistance effect (GMR effect) is preferable in application to MRAM and the reproduction magnetic head.

Figure 1:
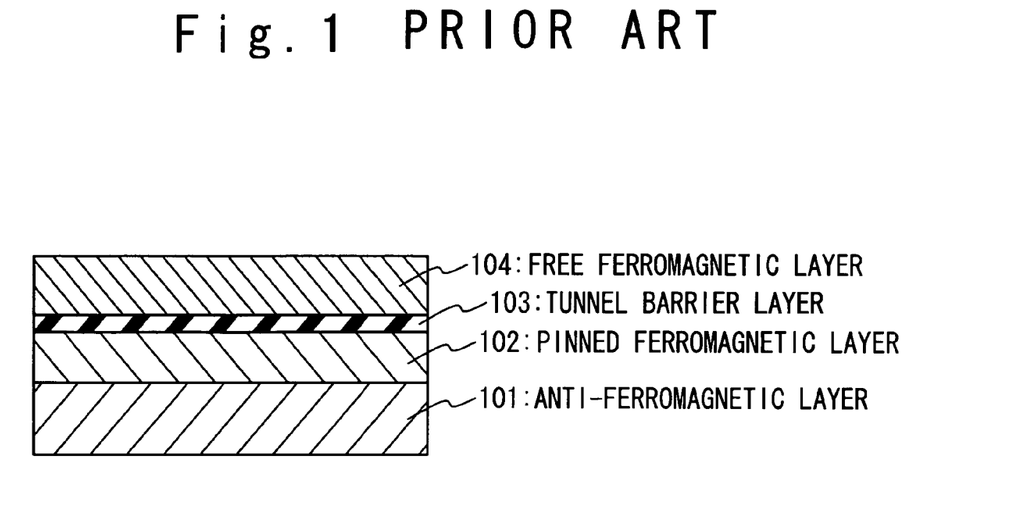
FIG. 1 is a cross sectional view showing a conventional magnetic resistance device.

As shown in FIG. 1, the magnetic resistance device showing the TMR effect is typically composed of an anti-ferromagnetic layer 101, a pinned ferromagnetic layer 102, a tunnel barrier layer 103 and a free ferromagnetic layer 104. For example, the anti-ferromagnetic layer 101 is formed of anti-ferromagnetic material such as Fe—Mn and Ir—Mn. For example, the pinned ferromagnetic material 102 and the free ferromagnetic layer 104 are formed of ferromagnetic material such as permalloy and have spontaneous magnetizations, respectively. The direction of the spontaneous magnetization of the pinned ferromagnetic material 102 is fixed through an exchange coupling operation received from the anti-ferromagnetic layer 101. A direction of the spontaneous magnetization of the free ferromagnetic layer 104 is reversible into a direction parallel or anti-parallel to that of the spontaneous magnetization of the pinned ferromagnetic material 102. The tunnel barrier layer 103 is formed of non-magnetic substance which is an insulator like alumina ($Al_2O_3$). The thickness of the tunnel barrier layer 103 is thin to the extent that tunnel current flows in the direction perpendicular to the surface of tunnel barrier layer 103 and typically is 1 to 3 nm. The magnetic resistance device having such a structure is sometimes called a magnetic tunnel junction (MTJ). The structure of the magnetic resistance device is disclosed in Japanese Laid Open Patent Application (JP-A-Heisei 4-103014), and U.S. Pat. No. 5,650,958.

The resistance of the magnetic resistance device changes due to the TMR effect in accordance with a relative relation of direction of the spontaneous magnetization of the pinned ferromagnetic layer 102 and that of the spontaneous magnetization of the free ferromagnetic layer 104. In an MRAM which contains magnetic resistance devices, the change of the resistance of the magnetic resistance device is used for the detection of stored non-volatile data. In the magnetic head which contains the magnetic resistance device, the change of the resistance of the magnetic resistance device is used for the detection of an external magnetic field.

A technique to improve the characteristic of the magnetic resistance device showing the TMR effect is disclosed in U.S. Pat. No. 5,966,012. In the magnetic resistance device showing the TMR effect, it is important to decrease the magnetostatic interaction between the ferromagnetic layers.

The above U.S. Pat. No. 5,966,012 discloses the technique, in which each of a pinned ferromagnetic layer and a free ferromagnetic layer contains two ferromagnetic layers and a non-magnetic layer interposed between the ferromagnetic layers. Such a structure effectively decreases the magnetostatic interaction between the ferromagnetic layers. It is described in the U.S. Pat. No. 5,966,012 to use a Ru layer as the non-magnetic layer.

A problem of the magnetic resistance device utilizing the TMR effect is heat resistance. A method of manufacturing the MRAM and the magnetic head contain a heat-treatment process. For example, the method of manufacturing the MRAM contains processes in which the magnetic resistance device is heated to a temperature in a range of 300° C. to 400° C., such as a process of forming an interlayer insulating film, a hydrogen sintering process of a transistor, and a packaging process. When a high temperature is applied to the magnetic resistance device, the material of the anti-ferromagnetic layer 101 diffuses into the tunnel barrier layer 103 and the free ferromagnetic layer 104 through the pinned ferromagnetic layer 102, to degrade the characteristic of the magnetic resistance device. Especially, when the anti-ferromagnetic layer 101 is formed of the anti-ferromagnetic material which contains manganese like Ir—Mn and Pt—Mn, the problem of the degradation of the magnetic resistance device is more important. Manganese has the nature easy to diffuse, and it is confirmed by a composition analysis and a section observation that manganese possibly reaches the tunnel barrier layer 103 and the free ferromagnetic layer 104 from the anti-ferromagnetic layer 101 in a short time.

A structure of the magnetic resistance device to effectively restrain the diffusion of Mn contained in the anti-ferromagnetic layer is disclosed in Japanese Laid Open Patent Application (JP-P2002-158381A). The magnetic resistance device has an anti-ferromagnetic layer which contains Mn, a magnetization fixing layer formed on the anti-ferromagnetic layer, a tunnel barrier layer formed on the magnetization fixing layer and a magnetization free layer formed on the tunnel barrier layer. The magnetization fixing layer has a structure in which an insulating layer or an amorphous magnetic layer is put between first and second ferromagnetic layers.

Another problem of the magnetic resistance device utilizing the TMR effect is that magnetic field necessary to reverse the direction of the spontaneous magnetization of the free ferromagnetic layer 104 is asymmetry with respect to the direction to be reversed due to the Neel effect (orange peel effect). The Neel effect is caused in the structure of two ferromagnetic layers and a non-magnetic layer interposed between the ferromagnetic layers and it depends on the non-flatness of each of the two ferromagnetic layers. The Neel effect combines the two ferromagnetic layers ferromagnetically and turns the directions of the spontaneous magnetizations of the two ferromagnetic layers to the same direction (in parallel). The Neel effect makes the magnetic field necessary to turn the directions of the spontaneous magnetizations of the two ferromagnetic layers in the anti-parallel direction larger than the magnetic field necessary to turn the directions of the spontaneous magnetizations of the two ferromagnetic layers in parallel. For the reason of the Neel effect, the magnetic field necessary to reverse the direction of the spontaneous magnetization of the free ferromagnetic layer 104 becomes asymmetry. The magnetic resistance device utilizing the TMR effect receives large influence of the Neel effect because the thickness of the tunnel barrier layer 103 interposed between the pinned ferromagnetic layer 102 and the free ferromagnetic layer 104 is very thin.

In conjunction with the above description, a magnetic memory device is disclosed in Japanese Laid Open Patent Application (JP-A-Heisei 11-238923). A magnetic device of this conventional example is composed of an insulating layer having a thickness through which a tunnel current can pass, and first and second ferromagnetic films arranged to put the insulating layer between them. A non-magnetic film is inserted in least one of the first and second ferromagnetic films. Or, the magnetic device is composed of granular magnetic films having the small ferromagnetic particles which are dispersed in a dielectric substance matrix and having magnetic coercive force, and a ferromagnetic film arranged closely to the granular magnetism film. Tunnel current flows between the granular magnetic film and the ferromagnetic film. A non-magnetic substance film is inserted into the ferromagnetic film. According to this conventional example, a desired output voltage value can be obtained and the decrease of a magnetic resistance changing percentage is less even if the current value flows into the ferromagnetic tunnel junction element is increased.

Also, a magneto-resistance effect device is disclosed in Japanese Laid Open Patent Application (JP-P2000-156530A). The magneto-resistance effect device of this conventional example is composed of a first magnetic layer, the direction of whose magnetization changes due to an external magnetic field, a second magnetic layer, a direction of whose magnetization is fixed, and a non-magnetic layer provided between the first and second magnetic layers. The magneto-resistance effect device is further composed of a metal barrier layer provided adjacent to the first magnetic layer and an electron reflection layer provided adjacent to the metal barrier layer and containing at least one selected from the group consisting of oxide, nitride, carbide, fluoride, chloride, sulfite and boride. Moreover, a metal lower layer and a crystal growth control layer may be provided. According to this conventional example, a long-term reliability is improved and an initial characteristic is also improved.

Also, a magnetic recording medium is disclosed in Japanese Laid Open Patent Application (JP-P2001-76329A). In the magnetic recording medium of this conventional example, a lower film is formed on a non-magnetic substrate. A magnetic film of a granular structure is formed on the lower film by a sputtering method using a target which consists of a mixture of ferromagnetic material and non-magnetic material with the resistance of $10^6$ Ωcm or below, or by a dual sputtering method using a target of a ferromagnetic material and a target of non-magnetic material with the resistance $10^6$ Ωcm below, and then a protection film is formed on it. According to this conventional example, the magnetic film of the granular structure with a good smoothness is provided such that friction with the magnetic head is small, and the magnetic recording medium is excellent in the durability.

Also, a magnetic head having a spin valve-type magnetic sensor is disclosed in Japanese Laid Open Patent Application (JP-P2001-101622A). The magnetic head of this conventional example has a laminate structure of a ferromagnetic fixed layer, a non-magnetic intermediate layer, and a soft magnetic free layer. The direction of the magnetization of the ferromagnetic fixed layer is fixed to a magnetic field sensed by an exchange coupling section formed directly on the whole surface with an anti-ferromagnetic film or a hard magnetic layer film. The direction of the magnetization of the soft magnetic free layer turns in accordance with an external magnetic field, and the magneto-resistance effect is caused based on change in a relative angle between the direction of the magnetization of the soft magnetic free layer and the direction of the magnetization of the ferromagnetic fixed layer. A pair of electrodes is provided to detect the change of the resistance. The ferromagnetic fixed layer is composed of a laminate layer of a first ferromagnetic film, a non-magnetic insertion layer and a second ferromagnetic film. The first ferromagnetic film and the second ferromagnetic film have sufficiently large ferromagnetic coupling to the magnetic field to be sensed through the non-magnetic insertion layer. The directions of the magnetizations of the first ferromagnetic film and the second ferromagnetic film are in parallel and the first ferromagnetic film and the second ferromagnetic film function as a substantially unitary ferromagnetic film. According to this conventional example, a magnetic head is provided to have a high output and a good waveform symmetry in a narrow gap and a narrow track.

Also, a magneto-resistance effect device is disclosed in Japanese Laid Open Patent Application (JP-P2002-94141A). The magneto-resistance effect device of this conventional example is composed of an anti-ferromagnetic layer, a fixed magnetic layer which is formed to contact the anti-ferromagnetic layer and in which the direction of its magnetization is fixed by exchange anisotropic magnetic field with the anti-ferromagnetic layer, a free magnetic layer formed through a non-magnetic intermediate layer on the fixed magnetic layer, and a bias layer which turns the direction of the magnetization of the free magnetic layer to a direction intersecting with the direction of the magnetization of the fixed magnetic layer. The anti-ferromagnetic layer and the fixed magnetic which is formed in contact with the anti-ferromagnetic layer are formed of an exchange coupling film. The anti-ferromagnetic layer and the ferromagnetic layer are formed in contact with each other and a exchange coupling magnetic field is generated in the interface between the anti-ferromagnetic layer and the ferromagnetic layer to fix the direction of the magnetization of the ferromagnetic layer a predetermined direction. The anti-ferromagnetic layer is formed of anti-ferromagnetic material which contains an element X (here, X is one or more of Pt, Pd, Ir, Rh, Ru, and Os) and Mn. Crystal grains appear in the section of the anti-ferromagnetic layer in the direction of the film thickness of the exchange coupling film and the crystal grains formed in the ferromagnetic layer are discrete in at least a part in the interface. According to this conventional example, even if a film of PtMn alloy which is the anti-ferromagnetic material excellent in corrosion resistance is used as the anti-ferromagnetic layer, the exchange coupling magnetic field can be made small in accordance with the state of the crystal grain boundaries.

DISCLOSURE OF INVENTION

An object of the present invention is to improve heat resistance of a magnetic resistance device utilizing the TMR effect.

Another object of the present invention is to restrain the Neel effect of a magnetic resistance device utilizing the TMR effect and to make a reverse magnetic field necessary to reverse spontaneous magnetization symmetrical.

In the first aspect of the present invention, a magnetic resistance device includes a first ferromagnetic layer formed of ferromagnetic material; a non-magnetic insulative tunnel barrier layer coupled to the first ferromagnetic layer; a second ferromagnetic layer coupled to the tunnel barrier layer and formed of ferromagnetic material; and an anti-ferromagnetic layer formed of anti-ferromagnetic material. The second ferromagnetic layer is provided between the tunnel barrier layer and the anti-ferromagnetic layer. At least a part of the second ferromagnetic layer is formed such that a line perpendicular to a surface of the second ferromagnetic layer on a side of the anti-ferromagnetic layer passes through at least two of crystal grains of the second ferromagnetic layer. By such a structure, it can be avoided that the grain boundary in the second ferromagnetic layer straightly passes though the second ferromagnetic layer, and diffusion of the material of the anti-ferromagnetic layer to the tunnel barrier layer can be restrained.

In order to further restrain the diffusion of the material of the anti-ferromagnetic layer to the tunnel barrier layer, it is preferable that a line perpendicular to a surface of the second ferromagnetic layer at an optional position on the surface of the second ferromagnetic layer on a side of the anti-ferromagnetic layer passes through at least two of crystal grains of the second ferromagnetic layer.

When the tunnel barrier layer is formed on the side opposite to a substrate on which the first ferromagnetic layer, the tunnel barrier layer, the second ferromagnetic layer and the anti-ferromagnetic layer are formed, that is, when the tunnel barrier layer is formed on the second ferromagnetic layer, the above-mentioned structure is preferable in that the first ferromagnetic layer, the tunnel barrier layer and the second ferromagnetic layer are flattened and the Neel effect is restrained.

Moreover, the magnetic resistance device may include a non-magnetic layer and a third ferromagnetic layer formed of ferromagnetic material. When the third ferromagnetic layer is formed on the anti-ferromagnetic layer, the non-magnetic layer is formed on the third ferromagnetic layer, and the second ferromagnetic layer is formed on the non-magnetic layer, the non-magnetic layer is preferably to have a function to miniature the crystal grains in the second ferromagnetic layer when the second ferromagnetic layer is formed.

It is possible to achieve by forming the non-magnetic layer and the second ferromagnetic layer of materials which belong to different point groups.

The concerned magnetic resistance device may include the non-magnetic layer coupled to the second ferromagnetic layer and the third ferromagnetic layer formed of ferromagnetic material and moreover is coupled to the non-magnetic layer. When the second ferromagnetic layer, the non-magnetic layer and the third ferromagnetic layer are situated between the tunnel barrier layer and the anti-ferromagnetic layer, the non-magnetic layer is preferably formed of an element selected from a group consisting of Ta, Al, Mg, Ti, Mo and W or an alloy of a plurality of elements selected from the group. The non-magnetic layer formed of an element selected from a group consisting of Ta, Al, Mg, Ti, Mo and W or an alloy of a plurality of elements selected from the group can effectively restrain the diffusion of the material of the anti-ferromagnetic layer, especially, Mn into the tunnel barrier layer.

In this case, it is preferable that the third ferromagnetic layer is formed on the anti-ferromagnetic layer, the non-magnetic layer is formed on the third ferromagnetic layer, and the second ferromagnetic layer is formed on the non-magnetic layer. It realizes a structure in which crystal grains of the second ferromagnetic layer are made small and in which a perpendicular line to the surface of the second ferromagnetic layer at an optional position of the surface of the second ferromagnetic layer passes through at least two of the crystal grains of the second ferromagnetic layer that the second ferromagnetic layer is formed on the non-magnetic layer of the above-mentioned material.

It is preferable that an average grain diameter of the second ferromagnetic layer is equal to or less than ⅔ of the film thickness of the second ferromagnetic layer, and it is more preferable that the average grain diameter of the second ferromagnetic layer is equal to or less than ½ of the film thickness of the second ferromagnetic layer.

The structure of the above-mentioned magnetic resistance device is preferable especially when the anti-ferromagnetic layer contains Mn.

In another aspect of the present invention, a magnetic resistance device includes a first ferromagnetic layer formed of ferromagnetic material; a non-magnetic insulative tunnel barrier layer coupled to the first ferromagnetic layer; a second ferromagnetic layer formed of ferromagnetic material and coupled to the tunnel barrier layer; and an anti-ferromagnetic layer formed of anti-ferromagnetic material containing Mn. The second ferromagnetic layer is provided between the tunnel barrier layer and the anti-ferromagnetic layer, and crystal grains in the second ferromagnetic layer are arranged to prevent diffusion of the Mn from the anti-ferromagnetic layer to the tunnel barrier layer. Crystal grains of the second ferromagnetic layer are arranged to prevent the diffusion of Mn from the anti-ferromagnetic layer to the tunnel barrier layer.

A method of manufacturing a magnetic resistance device of the present invention includes (A) forming an anti-ferromagnetic layer on a surface of a substrate in a vacuum chamber; (B) introducing an oxidizing gas into the vacuum chamber after forming of the anti-ferromagnetic layer; (C) exhausting the oxidizing gas from the vacuum chamber; (D) forming a pinned ferromagnetic layer on the anti-ferromagnetic layer after the oxidizing gas is exhausted; (E) forming a tunnel barrier layer on the first ferromagnetic layer; and (F) forming a second ferromagnetic layer on the tunnel barrier layer. The introduction of the oxidizing gas into the vacuum chamber after forming of the anti-ferromagnetic layer makes oxygen to be adhered to the surface of the anti-ferromagnetic layer. The adhered oxygen obstructs the growth of crystal grains in the pinned ferromagnetic layer to miniature the crystal grain of the pinned ferromagnetic layer. Through the miniaturization of the crystal grains in the pinned ferromagnetic layer, it is avoided that the grain boundaries of the pinned ferromagnetic layer straightly passes through the pinned ferromagnetic layer and the diffusion of the material of the anti-ferromagnetic layer to the tunnel barrier layer is restrained.

When the oxidizing gas is an oxygen gas, a partial pressure of the oxidizing gas is larger than 0 and is smaller than $1\times10-4$ Pa, when the oxidizing gas is introduced in the (B) step.

The method of manufacturing a magnetic resistance device of the present invention includes (G) forming an anti-ferromagnetic layer on a surface of a substrate; (H) forming a pinned ferromagnetic layer on the anti-ferromagnetic layer in an atmosphere containing an oxidizing gas; (I) forming a tunnel barrier layer on the pinned ferromagnetic layer; and (J) forming a free ferromagnetic layer on the tunnel barrier layer. A partial pressure of the oxidizing gas during the (H) process is determined such that the first ferromagnetic layer indicates electric conductivity. By forming the pinned ferromagnetic layer on the anti-ferromagnetic layer in the atmosphere containing an oxidizing gas, the growth of crystal grains in the pinned ferromagnetic layer is obstructed and the crystal grains in the pinned ferromagnetic layer are made small. Through the miniaturization of the crystal grains in the pinned ferromagnetic layer, it is avoided that the grain boundaries of the pinned ferromagnetic layer straightly passes through the pinned ferromagnetic layer and the diffusion of the material of the anti-ferromagnetic layer to the tunnel barrier layer is restrained.

When the oxidizing gas is an oxygen gas, the partial pressure of the oxidizing gas during the (H) process is larger than 0 and is smaller than $5 \times 10^{-5}$ Pa.

BEST MODE FOR CARRYING OUT THE INVENTION

Hereinafter, a magnetic resistance device of the present invention will be described with reference to the attached drawings.

(First Embodiment)

Figure 2:
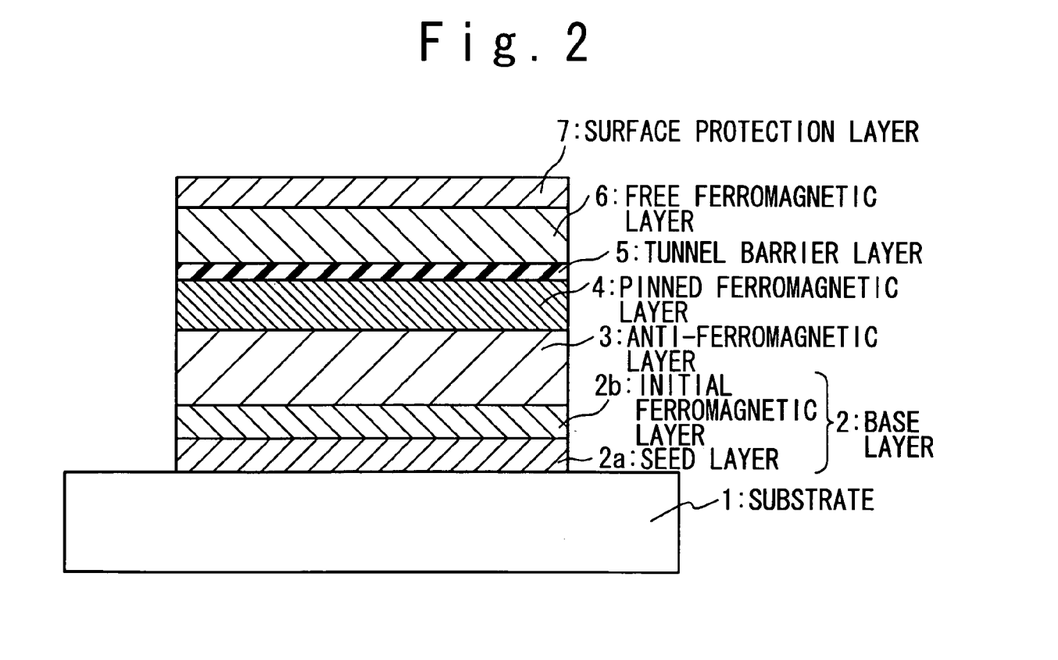
FIG. 2 is cross sectional view showing a magnetic resistance device according to a first embodiment of the present invention.

FIG. 2 shows a magnetic resistance device according to the first embodiment of the present invention. In the magnetic resistance device of the first embodiment, memory cells of a MRAM utilizing the magnetic resistance devices showing TMR effect are provided. The memory cell is composed of a substrate 1 and a base layer 2. The base layer 2 is formed on the substrate 1. The base layer 2 contains a seed layer 2a formed on the substrate 1 and an initial ferromagnetic layer 2b formed on the seed layer 2a. The seed layer 2a is typically formed of tantalum and the initial ferromagnetic layer 2b is formed of Ni—Fe.

On the base layer 2, an anti-ferromagnetic layer 3 is formed. For example, the anti-ferromagnetic layer 3 is formed of anti-ferromagnetic material such as Ir—Mn and Pt—Mn. On the anti-ferromagnetic layer 3, a pinned ferromagnetic layer 4 is formed. For example, the pinned ferromagnetic layer 4 is formed of ferromagnetic material such as Ni—Fe and Co—Fe. The pinned ferromagnetic layer 4 formed of the ferromagnetic material has spontaneous magnetization. The direction of the spontaneous magnetization of the pinned ferromagnetic layer 4 is fixed based on interaction received from the anti-ferromagnetic layer 3.

On the pinned ferromagnetic layer 4, a tunnel barrier layer 5 is formed. For example, the tunnel barrier layer 5 is formed of insulative non-magnetic material such as alumina ($Al_2O_3$). The tunnel barrier layer 5 is thin to the extent that the tunnel current flows in the thickness direction. The film thickness of the tunnel barrier layer 5 is 1 to 3 nm. On the tunnel barrier layer 5, a free ferromagnetic layer 6 is formed. For example, the free ferromagnetic layer 6 is formed of ferromagnetic material such as Ni—Fe and Co—Fe and has spontaneous magnetization. The direction of the spontaneous magnetization of the free ferromagnetic layer 6 is reversible in a direction parallel or anti-parallel to the direction of the spontaneous magnetization of the pinned ferromagnetic layer 4. The memory cell of FIG. 2 stores 1-bit data as the direction of the spontaneous magnetization of the free ferromagnetic layer 6. The resistance (that is, the resistance of the memory cell) between the pinned ferromagnetic layer 4 and the free ferromagnetic layer 6 is generated based on the TMR effect and changes in accordance with the direction of the spontaneous magnetization of the free ferromagnetic layer 6. Through the change of the resistance, it is possible to distinguish the data stored in the memory cell.

On the free ferromagnetic layer 6, a surface protection layer 7 is formed. The surface protection layer 7 is typically formed of tantalum. The surface protection layer 7 is used as an electrode connected with the outside of the memory cell.

Figure 3:
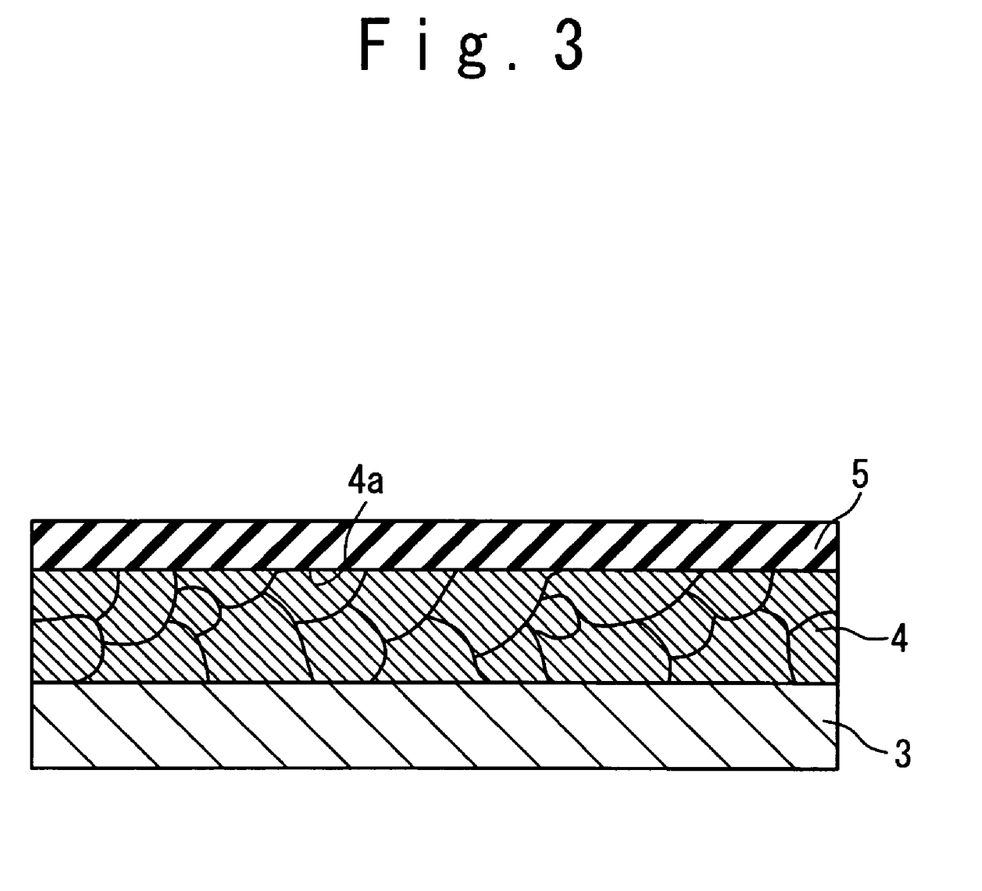
FIG. 3 is an expanded view showing a pinned ferromagnetic layer of the magnetic resistance device in the first embodiment.

The crystal grains of the pinned ferromagnetic layer 4 is made fine to prevent that material contained in the anti-ferromagnetic layer 3 diffuses into the tunnel barrier layer 5. As shown in FIG. 3, at least a part of the pinned ferromagnetic layer 4 is formed such that a line perpendicular to the surface 4a of the pinned ferromagnetic layer 4 passes through at least two of the crystal grains of the pinned ferromagnetic layer 4 for the reason of the miniaturization of the crystal grains of the pinned ferromagnetic layer 4. In this way, it can be avoided that the grain boundary of the pinned ferromagnetic layer 4 passes through the pinned ferromagnetic layer 4 in a straight. The diffusion of material into a thin film is often carried out by grain boundary diffusion through the grain boundary of the thin film. The structure that the grain boundary in the pinned ferromagnetic layer 4 does not pass through the pinned ferromagnetic layer 4 in straight makes the diffusion path of material long to effectively restrain the grain boundary diffusion. In order to restrain diffusion of the material contained in the anti-ferromagnetic layer 3 into the tunnel barrier layer 5 more effectively, it is preferable that the pinned ferromagnetic layer 4 is formed such that the perpendicular line to the surface 4a of the pinned ferromagnetic layer 4 passes through at least two of the crystal grains of the pinned ferromagnetic layer 4.

In order to further restrain the diffusion of the material contained in the anti-ferromagnetic layer 3 into the tunnel barrier layer 5, it is preferable that an average grain diameter of the crystal grains of the pinned ferromagnetic layer 4 is equal to or less than ⅔ of the film thickness of the pinned ferromagnetic layer 4, and more preferably, is equal to or less than ½ of the film thickness of the pinned ferromagnetic layer 4.

The miniaturization of the crystal grains of the pinned ferromagnetic layer 4 is effective in the point of the restraint of the Neel effect (orange peel effect). Because the crystal grains of the pinned ferromagnetic layer 4 are made small, the pinned ferromagnetic layer 4 is flattened. Therefore, the tunnel barrier layer 5 and the free ferromagnetic layer 6 are flattened. The flattening of the pinned ferromagnetic layer 4 and the free ferromagnetic layer 6 prevents a magnetic pole from being generated in the interface between the ferromagnetic layer and the tunnel barrier layer 5, and restrains the Neel effect between the pinned ferromagnetic layer 4 and the free ferromagnetic layer 6 effectively. Through the restraint of the Neel effect, an offset of a magnetic field necessary to reverse the direction of the spontaneous magnetization of the free ferromagnetic layer 6 is restrained.

The miniaturization of the grain diameters of crystal grains of the pinned ferromagnetic layer 4 is possible by manufacturing a magnetic resistance device by using either of the following two manufacturing methods. That is, in the first manufacturing method of the magnetic resistance device, the seed layer 2a, the initial ferromagnetic layer 2b and the anti-ferromagnetic layer 3 are formed on the substrate 1 in this order. The film formations of the seed layer 2a, the initial ferromagnetic layer 2b and the anti-ferromagnetic layer 3 are carried out in a vacuum chamber by using a sputtering method or a deposition method. After forming of the anti-ferromagnetic layer 3, an oxidizing gas of a small amount is introduced into the vacuum chamber that the film formation of the anti-ferromagnetic layer 3 has been carried out, and the anti-ferromagnetic layer 3 is exposed by the oxidation atmosphere. Oxygen gas is typically used as oxidizing gas. Through the exposure of the anti-ferromagnetic layer 3 to the oxidation atmosphere, the oxygen contained in the oxidizing gas is absorbed on the surface of the anti-ferromagnetic layer 3. Subsequently, after the vacuum chamber is vacuumed to a high vacuum, the pinned ferromagnetic layer 4 is formed on the anti-ferromagnetic layer 3. The oxygen absorbed on the surface of the anti-ferromagnetic layer 3 restrains the growth of crystal grains in the pinned ferromagnetic layer 4 and makes each crystal grain small. Subsequently, on the pinned ferromagnetic layer 4, the tunnel barrier layer 5, the free ferromagnetic layer 6 and the surface protection layer 7 are formed by a well known method to a person in the art, and the forming of the magnetic resistance device completes. When oxygen gas is used as the above-mentioned oxidizing gas, a partial pressure of the oxygen gas introduced into the vacuum chamber is preferably equal to or less than $1 \times 10^{-4}$ Pa. When the partial pressure of introduced oxygen gas is too high, the pinned ferromagnetic layer 4 is oxidized and the MR ratio of the magnetic resistance device degrades.

In the second manufacturing method of the magnetic resistance device which miniatures the grain diameter of crystal grains in the pinned ferromagnetic layer 4, the forming of the pinned ferromagnetic layer 4 is carried out in the atmosphere which slightly contains the oxidizing gas. Specifically, in the second manufacturing method of the magnetic resistance device, like the first manufacturing method of the magnetic resistance device, the seed layer 2a, the initial ferromagnetic layer 2b and the anti-ferromagnetic layer 3 are formed in this order on the substrate 1. Subsequently, in the atmosphere slightly containing the oxidizing gas, the pinned ferromagnetic layer 4 is formed by a sputtering method or the deposition method. A slight quantity of oxygen contained in the oxidizing gas is taken into the pinned ferromagnetic layer 4. The slight quantity of oxygen taken into the pinned ferromagnetic layer 4 restrains the growth of crystal grains in the pinned ferromagnetic layer 4 and makes the crystal grains small. After the forming of the pinned ferromagnetic layer 4, the tunnel barrier layer 5, the free ferromagnetic layer 6 and the surface protection layer 7 are formed on the pinned ferromagnetic layer 4 by a well known to a person in the art, and the forming of the magnetic resistance device completes. When the oxygen gas is used as the above-mentioned oxidizing gas, a partial pressure of oxygen gas in the film forming of the pinned ferromagnetic layer 4 is desirably equal to or less than $5 \times 10^{-5}$ Pa. When the partial pressure of the introduced oxygen gas is too high, the pinned ferromagnetic layer 4 is oxidized and the MR ratio of the magnetic resistance device degrades. The partial pressure of oxygen gas has been determined in such a way that the pinned ferromagnetic layer 4 is conductive.

The miniaturization of the crystal grains of the pinned ferromagnetic layer 4 by the above methods is suitable in the point that it is not required that the pinned ferromagnetic layer 4 is a multi-layer, in order to prevent the diffusion of the material of the anti-ferromagnetic layer 3. In the technique disclosed in the above-mentioned Japanese Laid Open Patent Application (JP-P2002-158381A), an insulating layer or an amorphous magnetic layer is formed between two ferromagnetic layers which act as the pinned ferromagnetic layer. The multi-layer structure of the pinned ferromagnetic layer makes the film thickness of the whole pinned ferromagnetic layer thick. It is generally difficult to process the ferromagnetic material, and it is not desirable that the film thickness of the whole pinned ferromagnetic layer is thick. Also, in the MTJ, because the current flows in a direction perpendicular to the film surface, it is not desirable that the insulating layer exists in the pinned ferromagnetic layer.

The structure of the magnetic resistance device and the magnetic resistance device manufacturing method in the above-mentioned embodiment are suitable especially when the anti-ferromagnetic layer 3 is formed of material containing manganese such as Ir—Mn and Pt—Mn. Manganese is easy to diffuse through a heat-treatment process. By reducing the grain diameters of crystal grains in the pinned ferromagnetic layer 4 formed on the anti-ferromagnetic layer 3 which contains manganese, diffusion of manganese into the tunnel barrier layer 5 is effectively prevented.

In this embodiment, the positions of the anti-ferromagnetic layer 3 and the pinned ferromagnetic layer 4 are interchangeable with the position of the free ferromagnetic layer 6. That is, the free ferromagnetic layer 6 may be formed on the initial ferromagnetic layer 2b. The tunnel barrier layer 5 may be formed on the free ferromagnetic layer 6, and the pinned ferromagnetic layer 4 may be formed on the tunnel barrier layer 6. The anti-ferromagnetic layer 3 may be formed on the pinned ferromagnetic layer 4. In this case, the pinned ferromagnetic layer 4, the tunnel barrier layer 5 and the free ferromagnetic layer 6 are not flattened. Therefore, the effect of the restraint of the Neel effect is not achieved. However, in the structure, it is possible to effectively restrain the diffusion of the material of the anti-ferromagnetic layer 3.

EXPERIMENT EXAMPLES

Experiment examples 1 and 2 as the magnetic resistance device according to the present invention were compared with a comparison example 1. In all of the experiment example 1, the experiment example 2 and the comparison example 1, the seed layer 2a was formed as a tantalum layer having the thickness of 3 nm. The initial ferromagnetic layer 2b was formed as a NiFe layer having the thickness of 3 nm, and the anti-ferromagnetic layer 3 was formed as an IrMn layer having the thickness of 10 nm. Also, the pinned ferromagnetic layer 4 was formed as a CoFe layer having the thickness of 10 nm, and the tunnel barrier layer 5 was formed as an AlOx layer having the thickness of 1.5 nm. The free ferromagnetic layer 6 was formed as a NiFe layer having the thickness of 5 nm, and the surface protection layer 7 was formed as a Ta layer having the thickness of 5 nm.

The magnetic resistance device of the experiment example 1 was formed by the first manufacturing method of the above-mentioned magnetic resistance device. After the base layer 2 and the anti-ferromagnetic layer 3 were formed in order by the sputtering method, oxygen gas was introduced as the oxidizing gas by a small amount in a vacuum chamber where the anti-ferromagnetic layer 3 had been formed. A partial pressure of oxygen gas was $5 \times 10^{-5}$ Pa. After introduction of the oxygen gas, the vacuum chamber was vacuumed to a high vacuum and the CoFe layer for the pinned ferromagnetic layer 4 was formed on the anti-ferromagnetic layer 3 by the sputtering method. Subsequently, after an Al film with the thickness of 1.5 nm was formed of the sputtering method, the Al film was oxidized in the oxygen plasma and the AlOx layer for the tunnel barrier layer 5 was formed. Subsequently, the free ferromagnetic layer 6 and the surface protection layer 7 were formed in the order by the sputtering method.

The magnetic resistance device of the experiment example 2 was formed by the second manufacturing method of the above-mentioned magnetic resistance device. After the Ta layer, the NiFe layer and the IrMn layer were formed in order by the sputtering method, a CoFe layer for the pinned ferromagnetic layer 4 was formed by the sputtering method in the atmosphere which contains oxygen gas of a small quantity. A partial pressure of the oxygen gas during the formation of the CoFe layer is $1 \times 10^{-5}$ Pa. Subsequently, an AlOx layer, a NiFe layer and a Ta layer were formed in order by the same process as in the magnetic resistance device of the experiment example 1.

The magnetic resistance device of the comparison example 1 was formed without carrying out the aggressive miniaturization of the pinned ferromagnetic layer 4. After a Ta layer, a NiFe layer and an IrMn layer were formed by the sputtering method in order, a CoFe layer was formed without being exposed to the atmosphere which contains oxygen gas and without oxygen gas introduced during the film formation. After that, the formation of an AlOx layer, a NiFe layer and a Ta layer was carried out in the order by the same process as in the magnetic resistance device of the experiment example 1.

Figure 4:
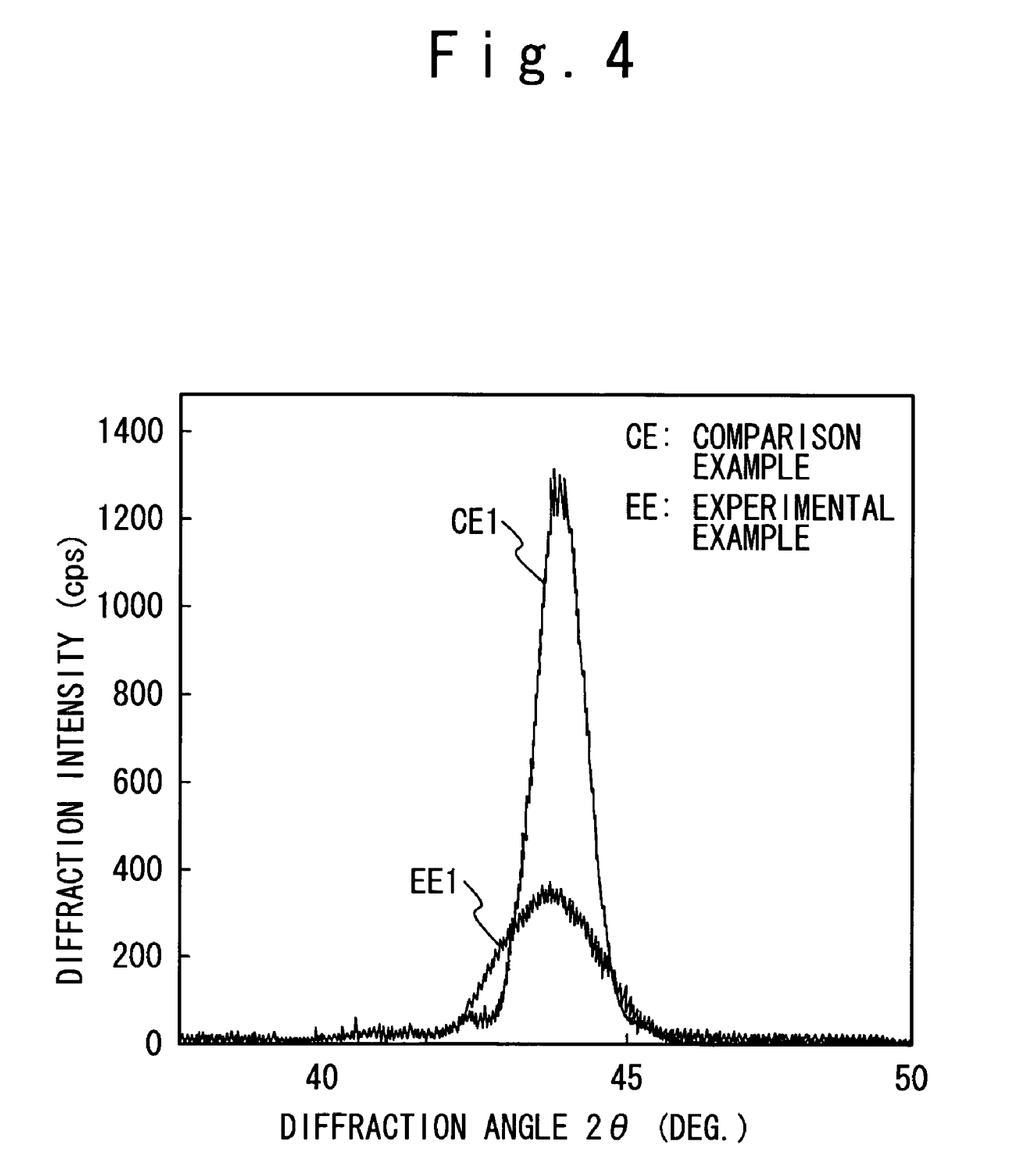
FIG. 4 is a diagram showing X-ray diffraction strength of the pinned ferromagnetic layer in an experiment example 1 of the present invention and a comparison example 1.

FIG. 4 is a graph showing X-ray diffraction strength of the CoFe layer which was measured by the θ–2θ method about the experiment example 1 and the comparison example 1. The CoFe layer of the magnetic resistance device of the experiment example 1 is lower in the diffraction peak intensity and wider in the peak width at half height than those of the CoFe layer of the magnetic resistance device of the comparison example 1. This means that the grain diameter of crystal grain in the CoFe layer of the magnetic resistance device of the experiment example 1 is smaller than the comparison example 1.

An average grain diameter in the CoFe layer of the magnetic resistance device is calculated the following equation (1):

$$T = 0.9 \lambda / B \cos \theta \quad (1)$$

where B is the peak width at half height in the diffraction peak, λ is the wavelength (0.1541 m) of the X-ray used for the measurement and θ is an X-ray incident angle.

The average grain diameters of grains in the CoFe layer of the magnetic resistance devices of the experiment example 1, the experiment example 2 and the comparison example 1 which are calculated by using the above equation (1) are 5.0 nm, 5.0 nm and 9.1 nm, respectively. This result shows that a plurality of crystal grains exist in the direction of the film thickness in the CoFe layer of the magnetic resistance device of the experiment example 1 and the experiment example 2 while only one crystal grain exists in the direction of the film thickness in the CoFe layer of the magnetic resistance device of the comparison example 1.

Annealing of 400° C. for one hour was carried out to the magnetic resistance devices of the experiment example 1, the experiment example 2 and the comparison example 1. After the annealing, the concentrations of Mn in the interface between the CoFe layer and the AlOx layer were compared using Auger electron spectroscopy (AES) method. In the comparison of the Mn concentrations, the peak intensity of Mn was corrected by using the peak values of Al and Co. When normalization was carried out by setting the Mn concentration of the comparison example 1 to one, the Mn concentrations of the experiment example 1 and the experiment example 2 were 0.2. This result shows that the diffusion of Mn is effectively restrained in the magnetic resistance device of the experiment example 1 and the experiment example 2.

In the magnetic resistance devices of the experiment example 1 and the experiment example 2, the decrease in the MR ratio by the annealing was restrained through the restraint of the diffusion of Mn. The MR ratios of the magnetic resistance devices of the experiment example 1, the experiment example 2 and the comparison example 1 before the annealing were 35%, 34.5% and 34.8%, respectively and were almost same. The MR ratios in the experiment example 1, the experiment example 2 and the comparison example 1 after the annealing at 400° C. for one hour were 21%, 19% and 3%, respectively. There were little decreases of the MR ratios in the magnetic resistance devices of the experiment example 1 and experiment example 2.

The effect of the miniaturization of crystal grains in the CoFe layer appeared as the restraint of the offset of the magnetic field necessary to reverse the direction of the spontaneous magnetization of the free ferromagnetic layer 6. The offset magnetic fields were 4.4 (Oe) in the magnetic resistance devices of the experiment example 1 and the experiment example 2, respectively, while the offset magnetic field was 11.30 (Oe) in the magnetic resistance device of the comparison example 1. It could be considered that this shows that the AlOx layer formed on the CoFe layer is flattened through the miniaturization of crystal grains in the CoFe layer in the experiment example 1 and the experiment example 2 so that the Neel effect is restrained.

(Second Embodiment)

Figure 5:
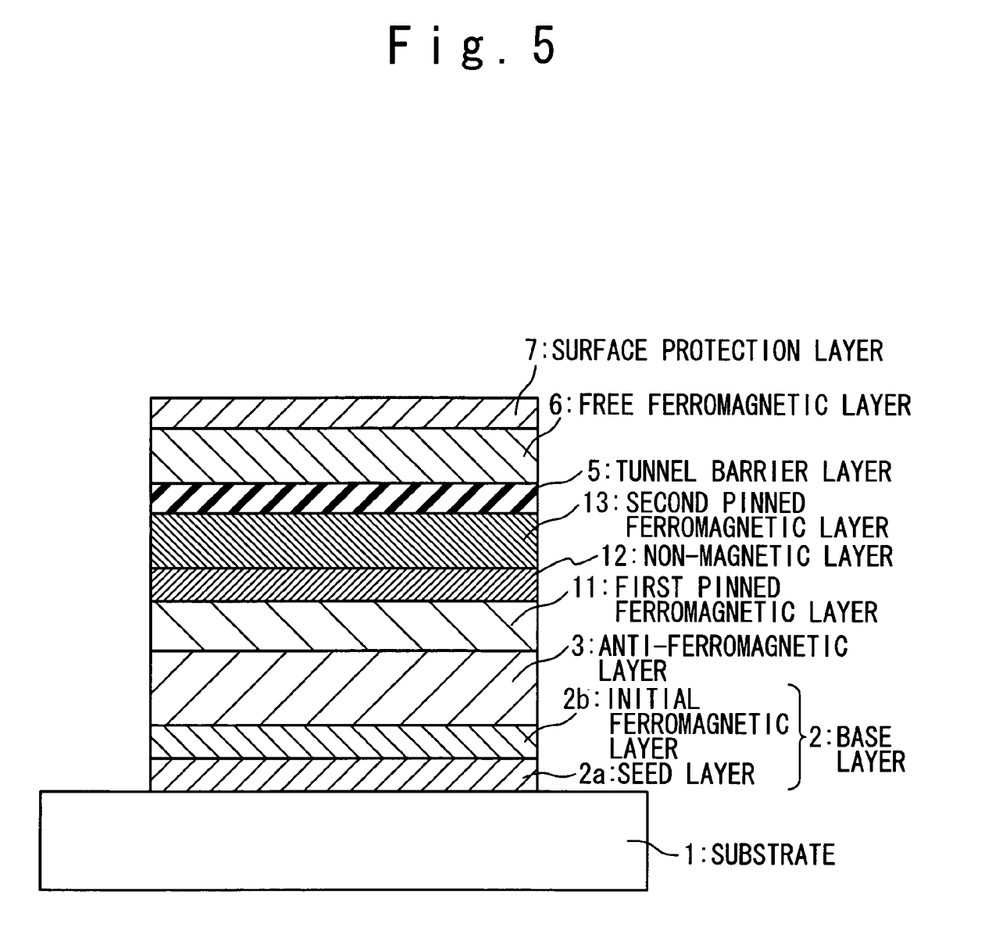
FIG. 5 is a cross sectional view showing a magnetic resistance device according to a second embodiment of the present invention.

FIG. 5 shows a magnetic resistance device according to the second embodiment of the present invention. In the second embodiment, diffusion of the material of the anti-ferromagnetic layer 3 into the tunnel barrier layer 5 is prevented by a different method from that of the first embodiment.

First, in the magnetic resistance device of the second embodiment, the pinned ferromagnetic layer 11, the non-magnetic layer 12 and the second pinned ferromagnetic layer 13 are formed on the anti-ferromagnetic layer 3 in order. The tunnel barrier layer 5 is formed on the second pinned ferromagnetic layer 13. For example, the first pinned ferromagnetic layer 11 is formed of the ferromagnetic material such as Ni—Fe and Co—Fe. The first pinned ferromagnetic layer 11 formed of the ferromagnetic material has the spontaneous magnetization. The direction of the spontaneous magnetization of the first pinned ferromagnetic layer 11 is fixed through the interaction with the anti-ferromagnetic layer 3.

The non-magnetic layer 12 is formed of one selected from the group consisting of Al, Ta, Mg, Ti, Mo, and W or alloy of some of them. The non-magnetic layer 12 formed of such material is a non-magnetic conductor.

The second pinned ferromagnetic layer 13 is formed of the ferromagnetic material such as Ni—Fe and Co—Fe, like the first pinned ferromagnetic layer 11. The second pinned ferromagnetic layer 13 formed of the ferromagnetic material has the spontaneous magnetization. The direction of the spontaneous magnetization of the second pinned ferromagnetic layer 13 is fixed through the interaction with the first pinned ferromagnetic layer 11. Because the non-magnetic layer 12 is formed of one selected from the group consisting of Al, Ta, Mg, Ti, Mo and W or alloy of some of them, the exchange coupling between the first pinned ferromagnetic layer 11 and the second pinned ferromagnetic layer 13 is ferromagnetic. Therefore, the spontaneous magnetizations of the first pinned ferromagnetic layer 11 and the second pinned ferromagnetic layer 13 turn to the same direction. The process in which the spontaneous magnetizations of the first pinned ferromagnetic layer 11 and second pinned ferromagnetic layer 13 are turned to desired directions is carried out through the application of the external magnetic field. In this case, it is suitable in the point that a strong magnetic field is not needed in the process which the spontaneous magnetization are turned to the desired directions that the directions of the spontaneous magnetization of the first pinned ferromagnetic layer 11 and the second pinned ferromagnetic layer 13 are same.

The resistance between the free ferromagnetic layer 6 and the second pinned ferromagnetic layer 13 (i.e., the resistance of the memory cell) changes in accordance with the direction of the spontaneous magnetization of the free ferromagnetic layer 6 through the TMR effect. Through the change of the resistance, it is possible to distinguish the data stored in the memory cell.

The non-magnetic layer 12 is formed of one selected from the group consisting of Al, Ta, Mg, Ti, Mo and W or alloy of some of them, and miniatures crystal grains in the second pinned ferromagnetic layer 13 formed on the non-magnetic layer 12. Like the pinned ferromagnetic layer 4 of the first embodiment, at least a part of the second pinned ferromagnetic layer 13 is formed through the miniaturization of crystal grains in the second pinned ferromagnetic layer 13 in such a way that a line perpendicular to the surface of the second pinned ferromagnetic layer 13 passes through at least two of the crystal grains of the second pinned ferromagnetic layer 13. Thus, it can be avoided for the grain boundary in the second pinned ferromagnetic layer 13 to pass through the pinned ferromagnetic layer 4 in straight, and the diffusion the material contained in the anti-ferromagnetic layer 3, especially Mn into the tunnel barrier layer 5 can be restrained. In order to restrain the diffusion of the material contained in the anti-ferromagnetic layer 3 into the tunnel barrier layer 5 more effectively, it is desirable that the second pinned ferromagnetic layer 13 is formed in such a way that the line perpendicular to the surface of the second pinned ferromagnetic layer 13 from an optional position of the surface thereof passes through at least two of the crystal grains of the second pinned ferromagnetic layer 13.

The mechanism of the miniaturization of crystal grains in the second pinned ferromagnetic layer 13 due to the non-magnetic layer 12 is not clear. The inventor estimates that the mechanism relates to the hindering of the growth of large crystal grain because the non-magnetic layer 12 formed of the above-mentioned material and the second pinned ferromagnetic layer 13 formed of the ferromagnetic material belong to different point groups and/or those lattice constants are different.

The miniaturization of crystals grains in the second pinned ferromagnetic layer 13 flattens the second pinned ferromagnetic layer 13, the tunnel barrier layer 5 and the free ferromagnetic layer 6 and restrains the Neel effect effectively, like the first embodiment. As mentioned above, the restraint of the Neel effect is effective in the point that the offset of the reverse magnetic field of the free ferromagnetic layer 6 can be reduced.

It is preferable in the point that the function to prevent the diffusion of Mn is given to the non-magnetic layer 12 itself that the non-magnetic layer 12 is formed the material selected from the group consisting of Al, Ta, Mg, Ti, Mo and W or alloy of some of them.

In order to further restrain the diffusion of the material contained in the anti-ferromagnetic layer 3 into the tunnel barrier layer 5, it is preferable that the second pinned ferromagnetic layer 13 is formed in such a way that an average grain diameter of the crystal grains of the pinned ferromagnetic layer 13 is equal to or less than ⅔ of the film thickness of the pinned ferromagnetic layer 13. It is more preferable that the average grain diameter is equal to or less than ½ of the film thickness of the second pinned ferromagnetic layer 13.

EXPERIMENT EXAMPLE

The experiment examples 3 to 12 of the magnetic resistance device of the present invention were compared with the comparison example 1 and a comparison example 2. The structures of the experiment example 3 to 12 of the magnetic resistance device and the comparison example 1 and 2 of the magnetic resistance device are as follows.

In the experiment examples 3 to 12, the CoFe layer having the thickness of 2 nm was formed as the first pinned ferromagnetic layer 11 and the CoFe layer having the thickness of 10 nm was formed as the second pinned ferromagnetic layer 13.

Figure 6:
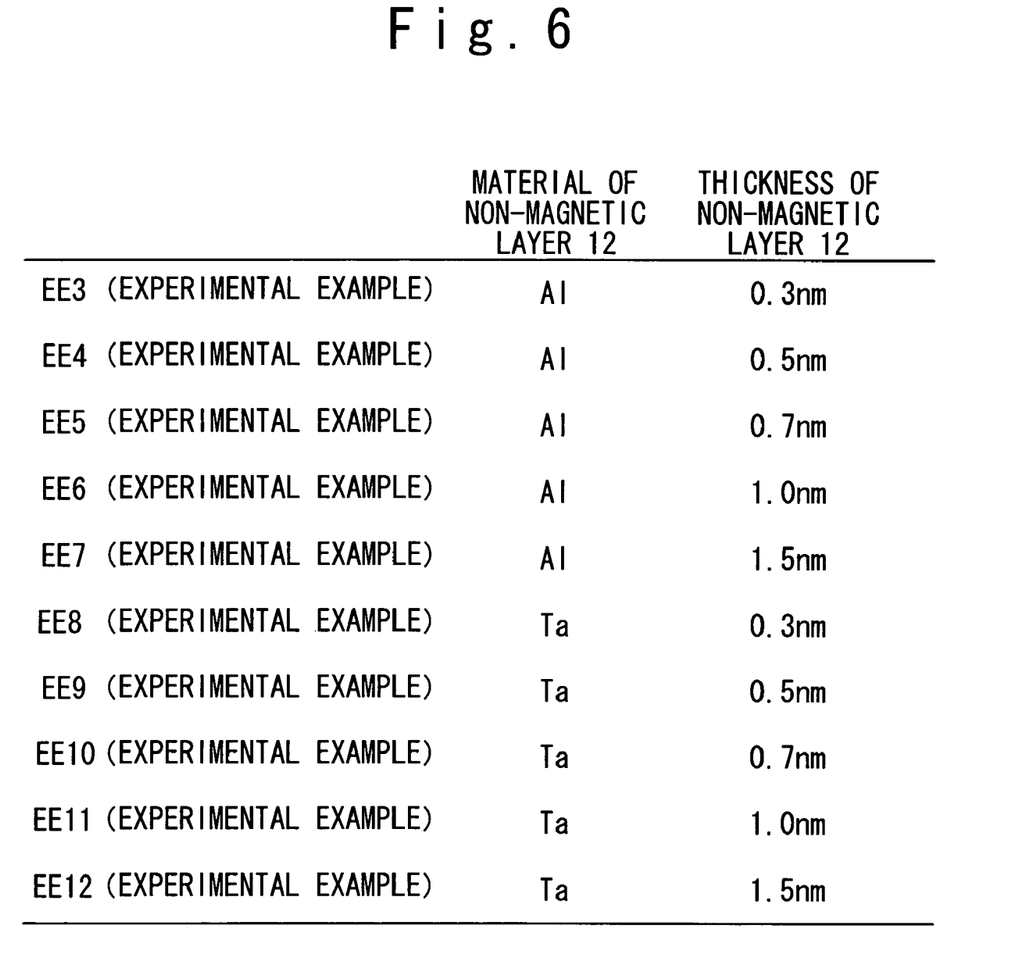
FIG. 6 is a table showing the material and thickness of non-magnetic layer in experiment examples 3 to 12 in the present invention.

The experiment example 3 to the experiment example 12 differ in the material and/or thickness of the non-magnetic layer 12 from each other. As shown in FIG. 6, the non-magnetic layers 12 in the experiment example 3 to the experiment example 7 of the magnetic resistance device were formed as the Al layer. The thicknesses of the non-magnetic layers 12 in the experiment example 3 to the experiment example 7 were 0.3, 0.5, 0.7, 1.0 and 1.5 nm, respectively. The non-magnetic layers 12 in the experiment example 8 to the experiment example 12 of the magnetic resistance device were formed as the Ta layer. The thicknesses of the non-magnetic layers 12 in the experiment example 8 to the experiment example 12 were 0.3, 0.5, 0.7, 1.0 and 1.5 nm, respectively.

The structure of the comparison example 1 of the magnetic resistance device was as described in the first embodiment. In the comparison example 1 of the magnetic resistance device, the CoFe layer having the thickness of 10 nm was used as the pinned ferromagnetic layer instead of the first pinned ferromagnetic layer 11, the non-magnetic layer 12 and the second pinned ferromagnetic layer 13.

The comparison example 2 of the magnetic resistance device differs from the experiment example 3 to the experiment example 12 in the material of the non-magnetic layer 12. In the experiment example 3 to the experiment example 12, the non-magnetic layers 12 were formed from the Al layer or the Ta layer, but the non-magnetic layer 12 of the comparison example 2 was formed from a Ru layer having the thickness of 1.0 nm.

The structures of the other portions of the experiment example 3 to the experiment example 12, the comparison example 1 and the comparison example 2 of the magnetic resistance device were same. In all of the experiment example 3 to the experiment example 12, the comparison example 1 and the comparison example 2, the seed layers 2a were formed from the tantalum layer having the thickness of 3 nm, the initial ferromagnetic layers 2b were formed from the NiFe layer having the thickness of 3 nm, the anti-ferromagnetic layers 3 were formed from the IrMn layer having the thickness of 10 nm, the tunnel barrier layers 5 were formed from the AlOx layer having the thickness of 1.5 nm, the free ferromagnetic layers 6 were formed from the NiFe layer having the thickness of 5 nm, and the surface protection layers 7 were formed from the Ta layer having the thickness of 5 nm.

Figure 7:
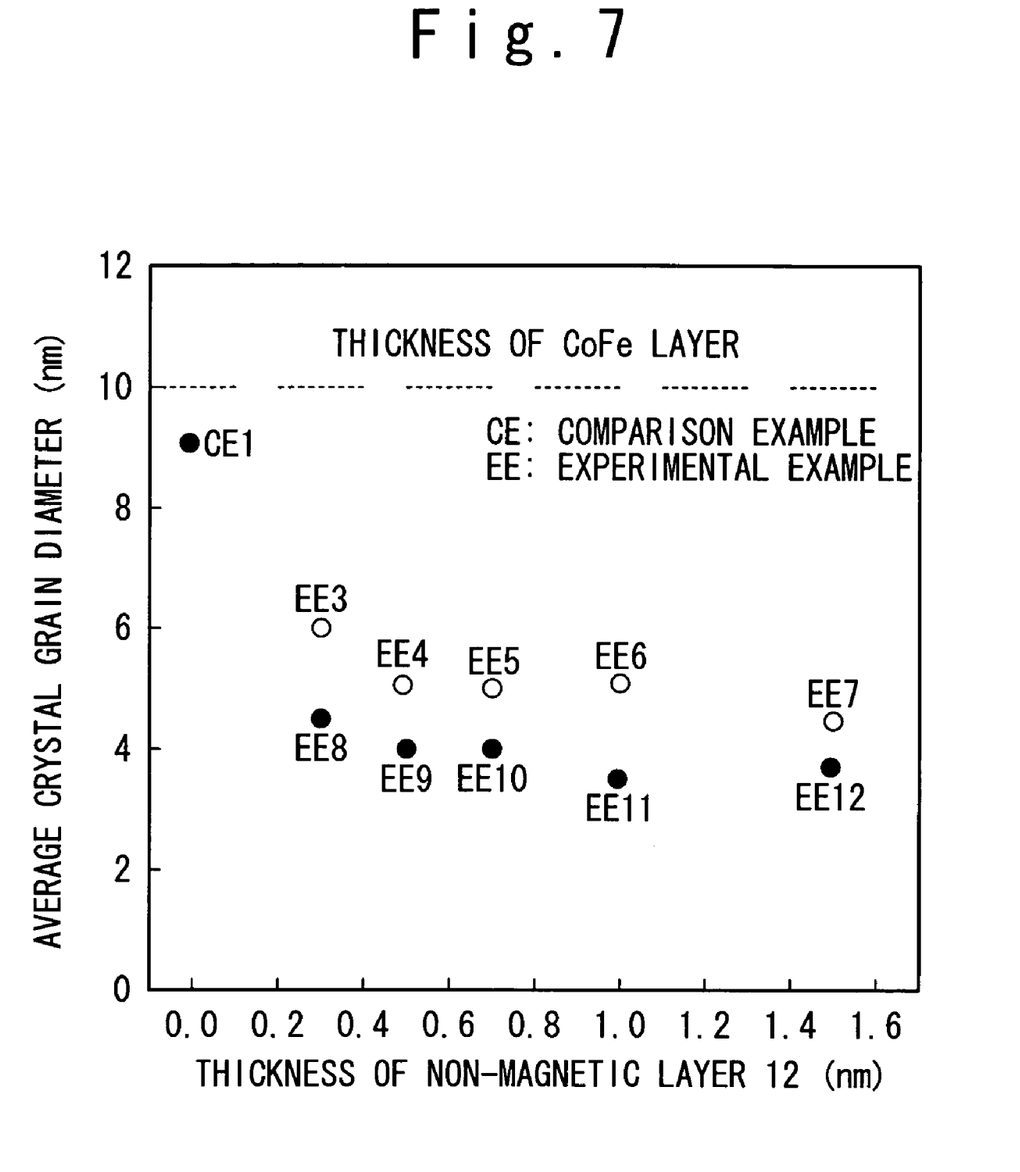
FIG. 7 is a diagram showing an average grain diameter of a second pinned ferromagnetic layer of the magnetic resistance device in the experiment example 3 to 12.

FIG. 7 shows average grain diameters of crystal grains in the second pinned ferromagnetic layers 13 of the experiment example 3 to the experiment example 12 of the magnetic resistance device. The average grain diameter was calculated from the peak width at half height in the X ray diffraction peak, like the first embodiment. The average grain diameters of the experiment example 3 to the experiment example 12 of the magnetic resistance device were in a range of 4.5 nm to 6.0 nm. This means that a plurality of crystal grains exist in the direction of the thickness in the second pinned ferromagnetic layers 13 of the experiment example 3 to the experiment example 12.

Figure 8:
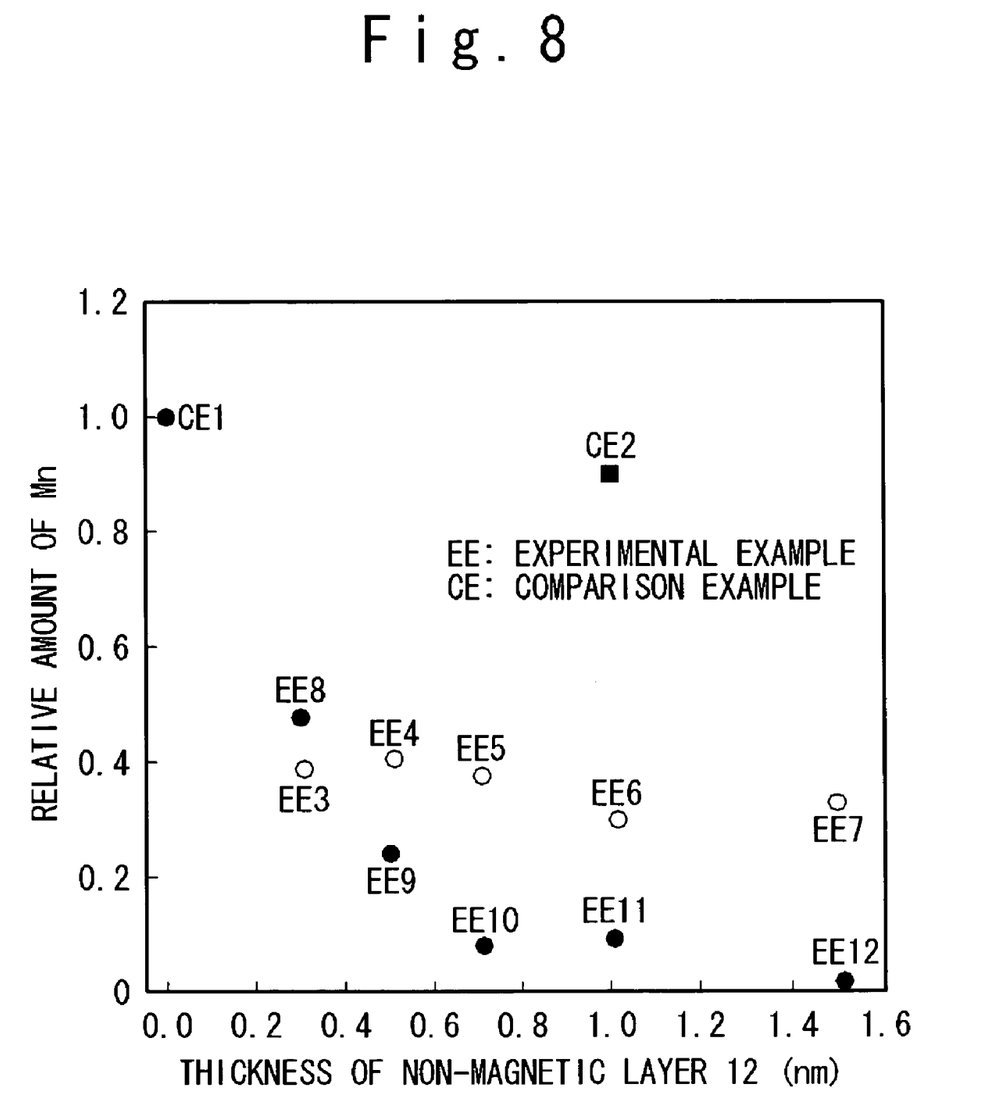
FIG. 8 is a diagram showing a quantity of Mn in the interface between the second pinned ferromagnetic layer and a tunnel barrier layer in the magnetic resistance device in the experiment examples 3 to 12.

FIG. 8 shows Mn concentration in the interface between the second pinned ferromagnetic layer 13 and the tunnel barrier layer 5 after the annealing was carried out to the magnetic resistance device at 400° C. for one hour. The Mn concentrations were normalized based on the Mn concentration in the interface between the pinned ferromagnetic layer and the tunnel barrier layer in the comparison example 1. The Mn concentrations were measured by AES, like the first embodiment.

As shown in FIG. 8, in the experiment example 3 to the experiment example 12 of the magnetic resistance devices in which the non-magnetic layers 12 were formed from the Al layer or the Ta layer, diffusion of Mn into the tunnel barrier layers 5 was restrained. In the experiment example 3 to the experiment example 12 of the magnetic resistance devices, diffusion of Mn into the tunnel barrier layers 5 is restrained although the non-magnetic layers 12 only has the thin film thickness of 0.3 nm.

In the comparison example 2 in which the non-magnetic layer 12 was formed from the Ru layer, the effect in which the diffusion of Mn into the tunnel barrier layer 5 is restrained is slightly found. However, the restraint of the diffusion is more effective in the experiment example 3 to the experiment example 12 of the magnetic resistance device, in which the non-magnetic layers 12 were formed from the Al layer or the Ta layer. Thus, it could be considered that the crystal grains are sufficiently made small to the extent that the diffusion of Mn into the second pinned ferromagnetic layer 13 can be restrained in the experiment example 3 to the experiment example 12 of the magnetic resistance devices in which the non-magnetic layer 12 is formed from the Al layer or the Ta layer, while the effect of the miniaturization of crystal grains in the second pinned ferromagnetic layer 13 is not sufficient in the comparison example 2 of the magnetic resistance device in which the non-magnetic layer 12 is formed from the Ru layer.

The dependence of the concentration of Mn diffused into the interface of the tunnel barrier layer 5 upon the film thickness of the non-magnetic layer 12 is small. This suggests that the miniaturization of crystal grains in the second pinned ferromagnetic layer 13 and prevention of the diffusion in the second pinned ferromagnetic layer 13 contribute more to prevent the diffusion of Mn rather than the non-magnetic layer 12 acts as a diffusion barrier.

Figure 9:
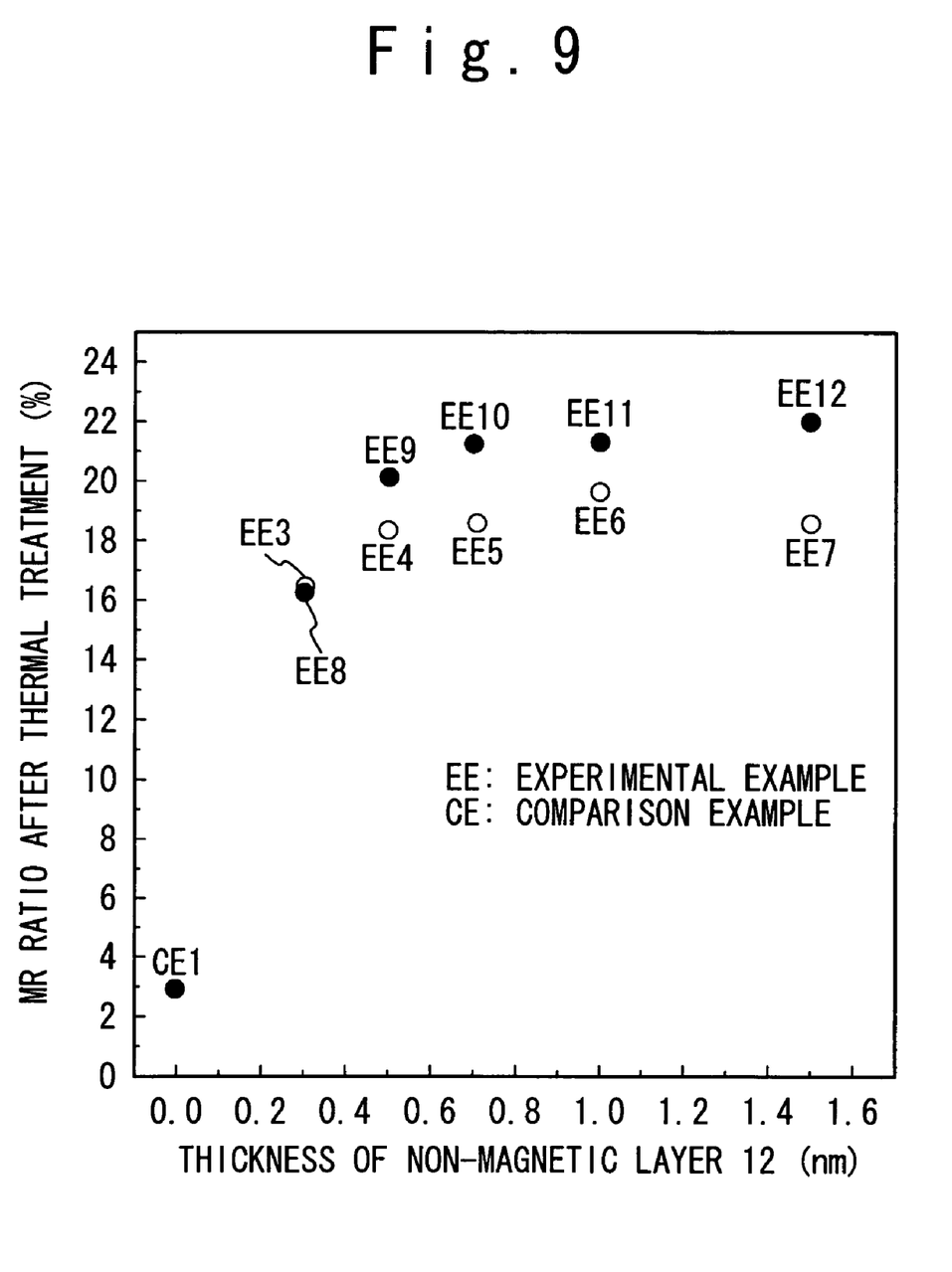
FIG. 9 is a diagram showing a MR ratio after heat-treatment (annealing) in the magnetic resistance device of the experiment examples 3 to 12.

In the experiment example 3 to the experiment example 12 of the magnetic resistance devices, the diffusion of Mn into the tunnel barrier layer 5 is restrained and further the degradation of the MR ratio by the annealing is reduced. As shown in FIG. 9, the MR ratios were in a range 17% to 23% in the experiment example 3 to the experiment example 12 of the magnetic resistance devices after the annealing at 400° C. for one hour and were more conspicuously larger than 3% of the MR ratio of the comparison example 1 of the magnetic resistance device.

The insertion of the non-magnetic layer 12 separates the anti-ferromagnetic material 3 and the second pinned ferromagnetic layer 13 and has a possibility to reduce exchange bias magnetic field $H_{ex}$ through the exchange coupling between the anti-ferromagnetic material 3 and the second pinned ferromagnetic layer 13. When the exchange bias magnetic field $H_{ex}$ becomes weak, the second pinned ferromagnetic material 13 becomes easy to reverse and therefore, the magnetic field range in which the directions of the spontaneous magnetizations of the free ferromagnetic layer 6 and the second pinned ferromagnetic layer 13 are anti-parallel becomes narrow. It is qualitatively preferable that the exchange bias magnetic field $H_{ex}$ is larger.

Figure 10:
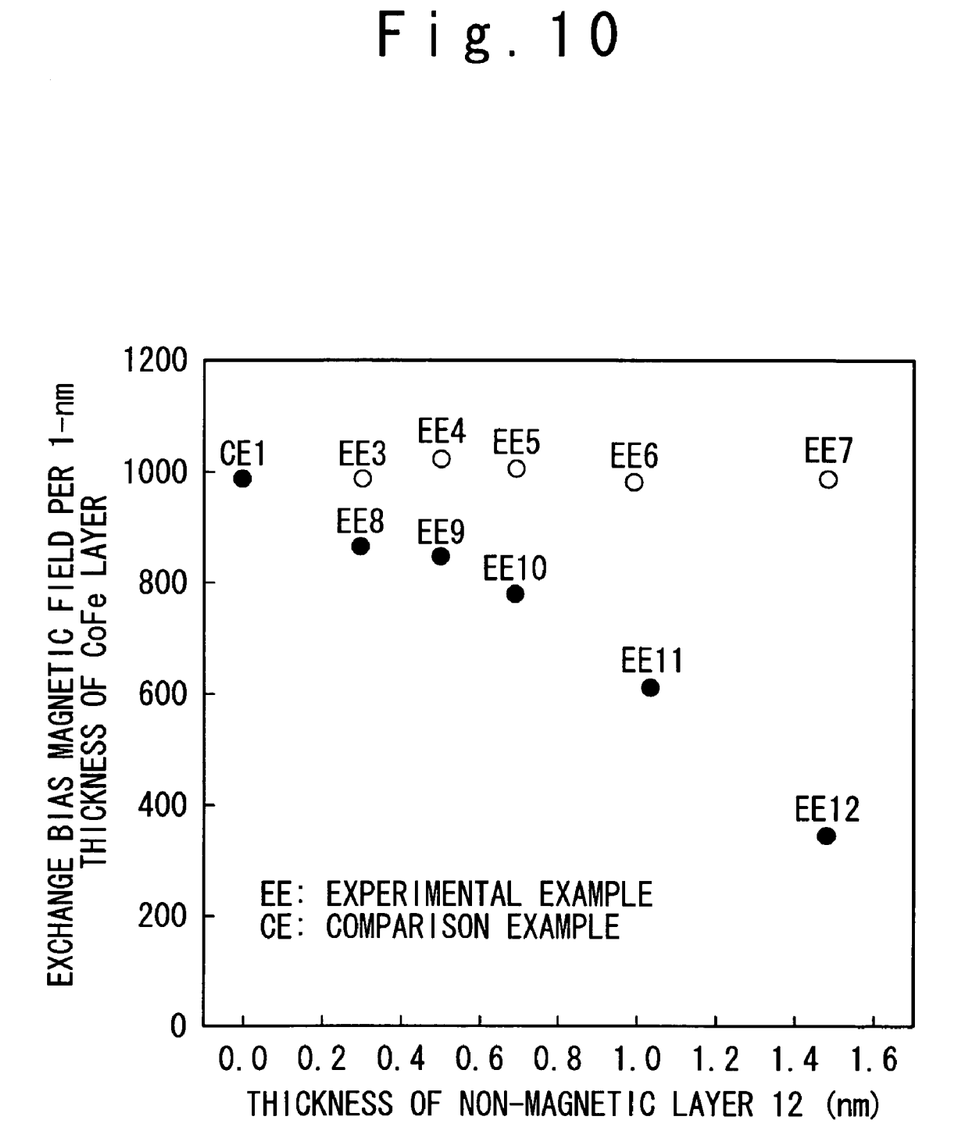
FIG. 10 is a diagram showing exchange bias magnetic field which is applied to the second pinned ferromagnetic layer in the magnetic resistance device of the experiment examples 3 to 12.

FIG. 10 shows the exchange bias magnetic field $H_{ex}$ applied to the second pinned ferromagnetic layer 13 in each of the experiment example 3 to the experiment example 12. In the comparison example 1, in which the anti-ferromagnetic layer was coupled directly on the pinned ferromagnetic layer, the exchange bias magnetic field $H_{ex}$ applied to the pinned ferromagnetic layer was about 980 (Oe). In the experiment example 3 to the experiment example 7, in which the non-magnetic layers 12 were formed from the Al layer, the degradation of the fixed force of the spontaneous magnetization of the second pinned ferromagnetic layer 13 did not occur when approximately the same exchange bias magnetic field $H_{ex}$ as the comparison example 1 of the magnetic resistance device was applied to the second pinned ferromagnetic layer 13. On the other hand, in the experiment example 8 to the experiment example 12 of the magnetic resistance devices, in which the non-magnetic layers 12 were formed from the Ta layer, the exchange bias magnetic field $H_{ex}$ was weakened. However, the magnitude of exchange bias magnetic field $H_{ex}$ was kept to the magnitude that is sufficient in case of practical use, even when the non-magnetic layers 12 were formed from the Ta layer. From the viewpoint of the securing of the exchange bias magnetic field $H_{ex}$, it is preferable that the non-magnetic layer 12 is formed from the Al layer.

In the experiment example 3 to the experiment example 12 of the magnetic resistance devices, the offset of the reverse magnetic field of the spontaneous magnetization of the free ferromagnetic layer 6 is restrained, like the first embodiment. The offset magnetic field in the experiment example 3 to the experiment example 12 of the magnetic resistance device was 5.4(Oe) at maximum, and was smaller than the offset magnetic field (11.30 (Oe)) of the comparison example 1.

When a Mg layer, Ti layer, Mo layer or W layer having the thickness of 0.7 nm were used for the non-magnetic layer 12, the Mn concentration in the interface between the second pinned ferromagnetic layer 13 and the tunnel barrier layer 5 decreased to a half of the Mn concentration of the comparison example 1 and the effect of the restraint of the diffusion of Mn was accomplished. Thus, it is made clear that the Mg layer, the Ti layer, the Mo layer and the W layer are available as the non-magnetic layer 12.

In the present invention, the heat resistance of the magnetic resistance device utilizing the TMR effect is improved.

Also, according to the present invention, the Neel effect of the magnetic resistance device utilizing the TMR effect is restrained and a magnetic field necessary for turning-over the spontaneous magnetization becomes symmetrical.

The invention claimed is:

1. A magnetic resistance device comprising:
   a first ferromagnetic layer formed of ferromagnetic material;
   a non-magnetic insulative tunnel barrier layer coupled to said first ferromagnetic layer;
   a second ferromagnetic layer coupled to said tunnel barrier layer and formed of ferromagnetic material; and
   an anti-ferromagnetic layer formed of anti-ferromagnetic material,
   wherein said second ferromagnetic layer is provided between said tunnel barrier layer and said anti-ferromagnetic layer, and
   at least a part of said second ferromagnetic layer is formed such that a line perpendicular to a surface of said second ferromagnetic layer on a side of said anti-ferromagnetic layer passes through at least two of crystal grains of said second ferromagnetic layer.

2. The magnetic resistance device according to claim 1, further comprising a substrate,
   wherein said first ferromagnetic layer, said tunnel barrier layer, said second ferromagnetic layer and said anti-ferromagnetic layer are formed above a surface of said substrate, and
   said tunnel barrier layer is formed on a side opposite to said substrate with respect to said second ferromagnetic layer.

3. The magnetic resistance device according to claim 1, further comprising:
   a non-magnetic layer; and
   a third ferromagnetic layer formed of ferromagnetic material,
   wherein said third ferromagnetic layer is formed on said anti-ferromagnetic layer,
   said non-magnetic layer is formed on said third ferromagnetic layer,
   said second ferromagnetic layer is formed on said non-magnetic layer, and
   said non-magnetic layer has a function to miniature said crystal grains in said second ferromagnetic layer when said second ferromagnetic layer is formed.

4. The magnetic resistance device according to claim 3, wherein said non-magnetic layer and said second ferromagnetic layer are formed of materials which belong to different point groups.

5. The magnetic resistance device according to claim 1, further comprising:
   a non-magnetic layer coupled to said second ferromagnetic layer; and
   a third ferromagnetic layer formed of ferromagnetic material and coupled to said non-magnetic layer,
   wherein said second ferromagnetic layer, said non-magnetic layer and said third ferromagnetic layer are provided between said tunnel barrier layer and said anti-ferromagnetic layer, and
   said non-magnetic layer is formed of an element selected from a group consisting of Ta, Al, Mg, Ti, Mo and W or an alloy of a plurality of elements selected from the group.

6. The magnetic resistance device according to claim 5, wherein said third ferromagnetic layer is formed on said anti-ferromagnetic layer,
   said non-magnetic layer is formed on said third ferromagnetic layer, and
   said second ferromagnetic layer is formed on said non-magnetic layer.

7. The magnetic resistance device according to claim 1, wherein an average grain diameter of grains in said second ferromagnetic layer is equal to or less than $2/3$ of a film thickness of said second ferromagnetic layer.

8. The magnetic resistance device according to claim 7, wherein said average grain diameter of said grains in said second ferromagnetic layer is equal to or less than $1/2$ of the film thickness of said second ferromagnetic layer.

9. The magnetic resistance device according to claim 1, wherein said anti-ferromagnetic layer contains Mn.

10. A magnetic resistance device comprising:
    a first ferromagnetic layer formed of ferromagnetic material;
    a non-magnetic insulative tunnel barrier layer coupled to said first ferromagnetic layer;
    a second ferromagnetic layer formed of ferromagnetic material and coupled to said tunnel barrier layer; and
    an anti-ferromagnetic layer formed of anti-ferromagnetic material containing Mn,
    wherein said second ferromagnetic layer is provided between said tunnel barrier layer and said anti-ferromagnetic layer, and
    crystal grains in said second ferromagnetic layer are arranged to prevent diffusion of said Mn from said anti-ferromagnetic layer to said tunnel barrier layer.

* * * * *